United States Patent
Mallia et al.

(10) Patent No.: US 8,051,672 B2
(45) Date of Patent: Nov. 8, 2011

(54) FLUID COOLED CABINET FOR ELECTRONIC EQUIPMENT

(75) Inventors: Paul Mallia, East Setauket, NY (US); Michael O'Sullivan, Bay Shore, NY (US)

(73) Assignee: AFCO Systems, Farmingdale, NY (US)

( * ) Notice: Subject to any disclaimer, the term of this patent is extended or adjusted under 35 U.S.C. 154(b) by 530 days.

(21) Appl. No.: 12/231,200

(22) Filed: Aug. 29, 2008

(65) Prior Publication Data

US 2009/0056910 A1   Mar. 5, 2009

Related U.S. Application Data

(60) Provisional application No. 60/966,893, filed on Aug. 30, 2007.

(51) Int. Cl.
- F25D 23/12 (2006.01)
- F28D 15/00 (2006.01)
- G06F 1/20 (2006.01)
- H05K 5/00 (2006.01)

(52) U.S. Cl. .............. 62/259.2; 165/104.33; 361/679.49

(58) Field of Classification Search ................ 236/49.3; 62/259.2; 165/104.33, 80.3; 361/687, 690, 361/696, 679.49
See application file for complete search history.

(56) References Cited

U.S. PATENT DOCUMENTS

| | | | |
|---|---|---|---|
| 3,348,609 A | 10/1967 | Dubin et al. | |
| 4,016,357 A | 4/1977 | Abrahamsen | |
| 4,458,296 A | 7/1984 | Bryant et al. | |
| 4,748,540 A * | 5/1988 | Henneberg et al. | 361/679.46 |
| 5,422,787 A | 6/1995 | Gourdine | |
| 6,042,474 A * | 3/2000 | Harvey et al. | 454/184 |
| 6,061,982 A * | 5/2000 | Owen | 52/220.1 |
| 6,088,224 A | 7/2000 | Gallagher et al. | |
| 6,151,212 A | 11/2000 | Schwenk et al. | |
| 6,185,098 B1 | 2/2001 | Benavides | |
| 6,341,064 B1 | 1/2002 | Bradley | |
| 6,462,944 B1 | 10/2002 | Lin | |
| 6,554,697 B1 | 4/2003 | Koplin | |
| 6,611,428 B1 | 8/2003 | Wong | |
| 6,643,123 B2 | 11/2003 | Hartel et al. | |
| 6,678,156 B2 | 1/2004 | Moizer | |
| 6,742,583 B2 | 6/2004 | Tikka | |
| 6,776,707 B2 | 8/2004 | Koplin | |
| 7,086,247 B2 * | 8/2006 | Campbell et al. | 62/259.2 |
| 7,182,208 B2 | 2/2007 | Tachibana | |
| 7,187,547 B1 | 3/2007 | French et al. | |

(Continued)

FOREIGN PATENT DOCUMENTS

EP           1017263 B1     7/2000

*Primary Examiner* — Chen Wen Jiang
(74) *Attorney, Agent, or Firm* — Dilworth & Barrese, LLP

(57) ABSTRACT

An electronic equipment cabinet is provided, which includes an enclosure defining an interior space. A support is disposed with the interior space and is configured to receive electronic equipment. The bottom portion defines a base plenum configured for at least one heat exchanger, which is in fluid communication with a low temperature fluid supply and a high temperature fluid return. A closed loop gas flow distribution pathway includes a first plenum communicating with the base plenum and configured to direct a low temperature gas to the support, and a second plenum configured to receive a high temperature gas flow from the support and direct the high temperature gas flow to the base plenum. A temperature sensor is disposed with the enclosure to sense the temperature of the high temperature gas flow within the enclosure.

17 Claims, 5 Drawing Sheets

U.S. PATENT DOCUMENTS

| | | |
|---|---|---|
| 7,226,353 B2 | 6/2007 | Bettridge et al. |
| 2002/0149911 A1* | 10/2002 | Bishop et al. .................. 361/690 |
| 2004/0099747 A1* | 5/2004 | Johnson et al. .............. 236/49.3 |
| 2004/0132398 A1* | 7/2004 | Sharp et al. ................... 454/184 |
| 2005/0250435 A1* | 11/2005 | Sharp et al. ................... 454/184 |
| 2006/0044758 A1 | 3/2006 | Spangberg |
| 2006/0103504 A1 | 5/2006 | Vassallo |
| 2006/0180301 A1* | 8/2006 | Baer ............................. 165/299 |
| 2008/0105412 A1* | 5/2008 | Carlsen et al. ........... 165/104.33 |

* cited by examiner

FLUID COOLED CABINET FOR ELECTRONIC EQUIPMENT

CROSS-REFERENCE TO RELATED APPLICATION

The present application claims priority to U.S. Provisional Application Ser. No. 60/966,893 filed Aug. 30, 2007, which is herein incorporated by reference in its entirety.

BACKGROUND

1. Field of the Invention

This invention relates generally to cabinet systems for housing and maintaining electronic equipment. More specifically, the present disclosure is directed to a cabinet system having a closed loop, fluid cooled design that employs a heat exchanger for regulating temperature and cooling heat generating electronic components.

2. Background of the Art

Cabinets for storing of electronic equipment are well known. These cabinets can be designed to enclose and store electronic equipment on racks in a vertical arrangement. The electronic equipment may include computers, data servers, storage systems, communication systems, audio/video components and other similar equipment.

These cabinets may also be configured to store blade servers, which are single circuit boards populated with components, such as, processors, memory and network connections. The cabinet can include enclosures or slots for receiving the blades.

It is desirable for the efficient operation of the electronic equipment, such as blade servers, to maintain an acceptable working temperature within the cabinet and avoid overheating of the electronic equipment. However, the electronic equipment stored in the cabinet typically generate heat during operation, and for example, the chassis of a blade server can create substantial amounts of heat thereby greatly increasing the heat load in the cabinet. This heat load causes an increase in the internal temperature of the cabinet. This temperature eventually exceeds the acceptable working temperature for the electronic equipment, resulting in overheating. Overheating of the electronic equipment can lead to equipment error, failure, shutdown, damage, shortened life and low reliability.

Various prior attempts have been made to overcome the drawbacks associated with the excessive heat loads and/or accumulation of heat generated during operation of electronic equipment stored in a cabinet. One attempt places several such cabinets in a room, which is air conditioned or supplied with ducted cool air. This attempt, however, suffers from several disadvantages such as the requirements of cooling the entire room and its contents, the adverse effect of one cabinet temperature relative to another, and the inability to upgrade electronic equipment because the cooling capacity has reached its maximum.

Other attempts include cabinet designs having multiple front and rear access openings, which may include fan units. These designs disadvantageously have difficulty maintaining uniform temperature within the cabinet due to greater amounts of heat being found at the top of the cabinet resulting in temperature gradients from the top to the bottom of the cabinet. In these cases, the equipment located near the top is more prone to failure from overheating.

Still other attempts include ducted cool air assemblies. However, these designs do not account for temperature gradients or provide reliable temperature regulation. In some cases, these designs are configured for an initial equipment load and programmed to operate at full capacity, regardless of the heating load. Thus, these cooling designs are in effect static and unable to accommodate load changes. In the event of equipment failure or discontinuity, many industries cannot afford down time to accommodate changes. Further, these designs can disadvantageously waste power and cooling capacity.

Therefore, it would be desirable to overcome the disadvantages and drawbacks of the prior art with a cabinet for housing and maintaining electronic equipment, which includes a system having a closed loop, fluid cooled design that employs a heat exchanger for regulating temperature and cooling heat generating electronic components, as well as related methods of use. It would be desirable if the cabinet employs a redundant cooling design having a plurality of heat exchangers. It is most desirable that the cabinet includes a plurality of variable speed fans to maintain cooling capacity. It is contemplated that the cabinet of the present disclosure is easily and efficiently manufactured and assembled.

SUMMARY

Accordingly, a cabinet for housing and maintaining electronic equipment is disclosed that includes a system having a closed loop, fluid cooled design employing a heat exchanger for regulating temperature and cooling heat generating electronic components, as well as related methods of use, which overcomes the disadvantages and drawbacks of the prior art. Desirably, the cabinet employs a redundant cooling design having a plurality of heat exchangers. Most desirably, the cabinet includes a plurality of variable speed fans to maintain cooling capacity. It is envisioned that the cabinet is easily and efficiently manufactured and assembled.

In one embodiment, the cabinet is a 42 kilowatt (kW) water-cooled enclosure system for extreme high-density water-cooled applications. The cabinet system is preferably used with blade server applications, and configured for performance and redundancy for thermal applications up to 42 kW.

The water-cooled cabinet system utilizes a closed loop system that delivers cooling to the server load. The cabinet system is fully redundant and includes two 42 kW heat exchangers and four 1650 cubic feet per minute (CFM) variable speed fan assemblies. The cabinet system may be employed to assimilate into current datacenter designs by sinking the heat exchangers into the raised floor, allowing accessibility for up to 52 rack units (RU) of rack space, while providing serviceability. It is contemplated that the cabinet system may be employed with 42 RU, to accommodate six 7 RU blade centers. It is further contemplated that the cabinet system may connect to a single or redundant chilled water supply. The heat exchanger assembly may be disposed below a raised floor such that the fluid supply does not travel above the raised floor or near equipment. It is envisioned that the cabinet system may include an advanced mixing valve to utilize hot water generated by the enclosure to regulate cold water temperatures to the heat exchangers. It is further envisioned that the cabinet system uses N+1 redundancy in fan capacity such that the loss of one fan does not cause failure and cooling capacity is maintained.

In one particular embodiment, in accordance with the principles of the present disclosure, an electronic equipment cabinet is provided. The electronic equipment cabinet includes an enclosure defining an interior space and having an upper portion and a lower portion. A support is disposed with the interior space and is configured to receive electronic equipment. The bottom portion defines a base plenum configured for disposal of at least one heat exchanger. The at least one heat exchanger is in fluid communication with a low temperature fluid supply and a high temperature fluid return. The at least one heat exchanger is configured to reduce a high temperature gas to a low temperature gas.

A closed loop gas flow distribution pathway includes a first plenum communicating with the base plenum and is configured to direct the low temperature gas to the support. The gas flow distribution pathway further includes a second plenum configured to receive a high temperature gas flow from the support and direct the high temperature gas flow to the base plenum. A temperature sensor is disposed with the enclosure to sense the temperature of the high temperature gas flow within the enclosure. The support can include shelving configured to receive electronic equipment. The support may be configured to receive at least one or a plurality of blade server chassis. The top portion can include a cable trough.

The enclosure can include a front wall and a rear wall. The second plenum can include at least one fan configured to receive the high temperature gas flow from the support and direct the high temperature gas flow to the base plenum. The second plenum may include a plurality of fans configured to receive the high temperature gas flow from the support and direct the high temperature gas flow to the base plenum.

The electronic equipment cabinet may include a control module configured to receive temperature sensing data from the temperature sensor to control the at least one fan and the at least one heat exchanger for regulating temperature of the high temperature gas flow. The electronic equipment cabinet may include an intake temperature sensor disposed with the enclosure to sense the temperature of the low temperature gas flow within the enclosure. A pressure sensor may be disposed with the enclosure to sense the pressure of the at least one fan.

The control module can be configured to receive pressure sensing data from the pressure sensor and temperature sensing data from the temperature sensor to control the at least one fan and the at least one heat exchanger for regulating temperature of the high temperature gas flow.

In an alternate embodiment, the electronic equipment cabinet has a mixing valve disposed between the at least one heat exchanger and the high temperature fluid return. The mixing valve is configured to regulate temperature of the low temperature fluid supply to the at least one heat exchanger.

The low temperature fluid supply and the high temperature fluid return may be connected to a chiller. The second plenum may be defined by a shroud. The second plenum can include a plurality of fans disposed in linear alignment therealong. At least a portion of the low temperature fluid supply and the high temperature fluid return can be disposed in a floor plenum external to the closed loop gas flow distribution pathway.

In another alternate embodiment, a method for maintaining electronic equipment at a predetermined temperature is provided. The method includes the steps of providing an electronic equipment cabinet, similar to those described herein; forcing the high temperature gas into the base plenum with at least one fan of the second plenum; drawing the high temperature gas across the at least one heat exchanger and reducing the high temperature gas to a low temperature gas; drawing the low temperature gas from the base plenum into the first plenum; drawing the low temperature gas across the support to absorb heat and raise to the high temperature gas that is drawn into the second plenum with the at least one fan of the second plenum; sensing the temperature of the high temperature gas flow drawn into the second plenum; and controlling the temperature of the high temperature gas with the control module based on the temperature sensing data.

In another alternate embodiment, the electronic equipment cabinet includes an enclosure including an interior space defined by a top portion, a bottom portion, a front wall and a rear wall thereof. A plurality of racks are configured to support blade servers and are disposed with the interior space of the enclosure. The bottom portion defines a base plenum configured for disposal of two heat exchangers. The heat exchangers are in fluid communication with a low temperature fluid supply and a high temperature fluid return, and configured to reduce a high temperature gas to a low temperature gas.

A closed loop gas flow distribution pathway includes a front plenum communicating with the base plenum and being configured to direct the low temperature gas to the support. The gas flow distribution pathway further includes a rear plenum including a plurality of fans configured to draw a high temperature gas flow from the support and direct the high temperature gas flow to the base plenum.

A first temperature sensor is disposed with the enclosure to sense the temperature of the high temperature gas flow within the enclosure. A second temperature sensor is disposed with the enclosure to sense the temperature of the low temperature gas flow within the enclosure. A pressure sensor is disposed with the enclosure to sense the pressure of the plurality of fans.

A control module is disposed with the enclosure and communicates with the sensors to receive data to control the fans and heat exchangers for regulating the temperature of the high temperature gas and the low temperature gas.

BRIEF DESCRIPTION OF THE DRAWINGS

The above-mentioned and other features of this disclosure, and the manner of attaining them, will become more apparent and the disclosure itself will be better understood by reference to the following description of embodiments of the disclosure taken in conjunction with the accompanying drawings, wherein.

DETAILED DESCRIPTION OF PREFERRED EMBODIMENT(S)

Figure 1:
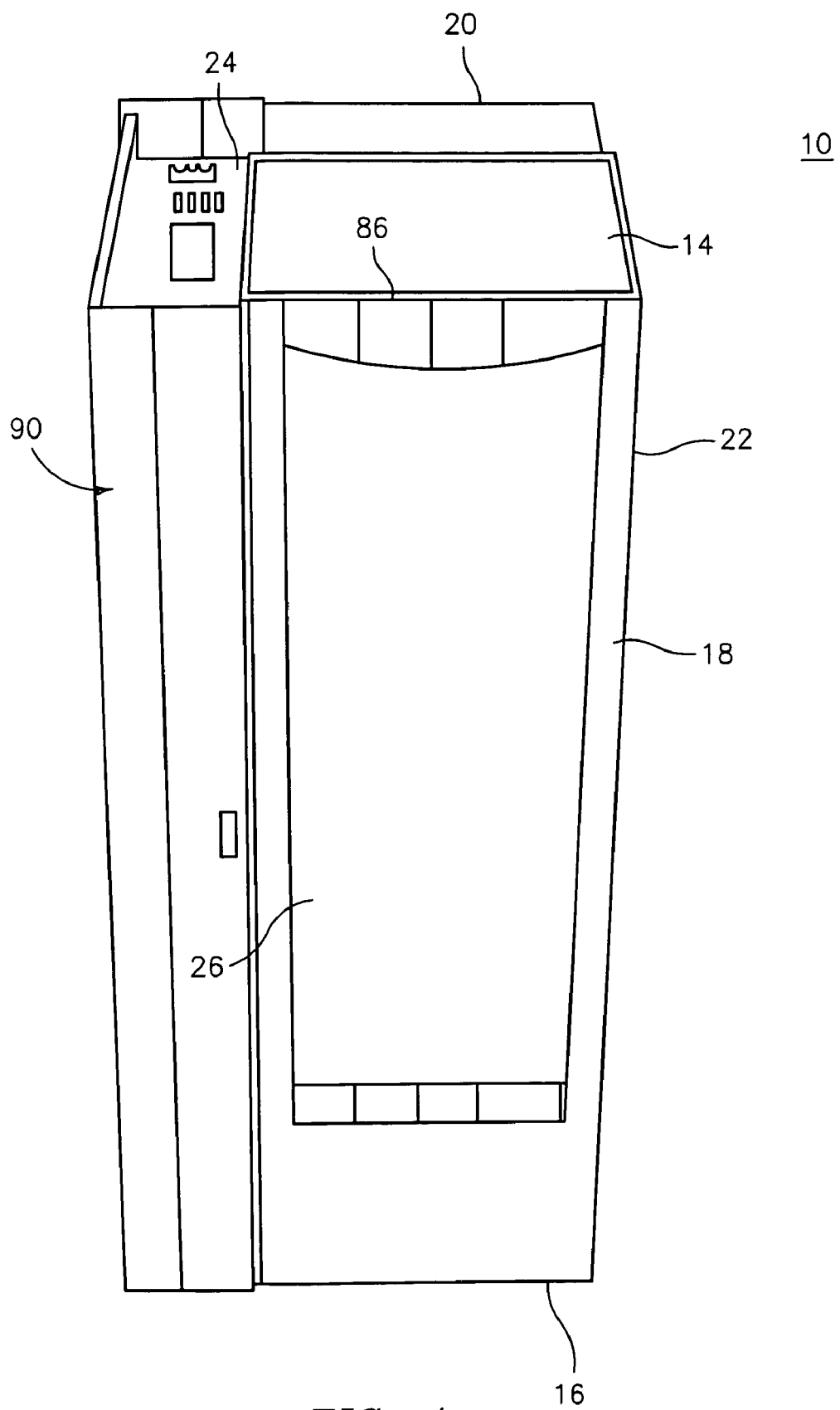
FIG. 1 is a front perspective view of one particular embodiment of a cabinet system in accordance with the principles of the present disclosure.

The exemplary embodiments of the cabinet system and methods of use disclosed are discussed in terms of housing and maintaining electronic equipment and more particularly, in terms of a system having a closed loop, fluid cooled design employing a heat exchanger for regulating temperature and cooling heat generating electronic components. It is envisioned that the present disclosure may be employed with a range of applications including various types of electronic equipment. The electronic equipment may include computers, data servers, storage systems, communication systems, audio/video components and telecommunication equipment.

It is envisioned that the present disclosure may be employed with blade server technology. It is further envisioned that the present disclosure may be used as a dynamic cooling system to accommodate additional equipment, modified equipment, and/or changing heat loads. The temperature regulation and associated cooling of the present disclosure can be modified during use of the electronic equipment. The present disclosure may also be employed with modified closed loop system including portions that are not within the closed loop.

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

The following discussion includes a description of an electronic equipment cabinet having a closed loop, fluid cooled configuration employing a heat exchanger, related components and exemplary methods of employing the cabinet in accordance with the principles of the present disclosure. The electronic equipment cabinet is discussed in terms of a closed loop system whereby a gas is recirculated through the system, which is substantially impervious to gas, or ambient air, outside the closed portion of the system. Alternate embodiments are also disclosed. Reference will now be made in detail to the exemplary embodiments of the present disclosure, which are illustrated in the accompanying figures. Turning now to FIGS. 1-5, there is illustrated an electronic equipment cabinet 10 having a closed loop, fluid cooled configuration in accordance with the principles of the present disclosure.

The components of electronic equipment cabinet 10 are fabricated from materials suitable for electronic equipment housing and maintenance applications, such as, for example, polymerics and/or metals, depending on the particular application and/or preference. Semi-rigid and rigid polymerics are contemplated for fabrication, as well as resilient materials, such as molded polyurethane and polypropylene. The fan motors, electronics and power components of cabinet 10 may be fabricated from those suitable for an electronic equipment housing and maintenance application and in particular, cooling. Cabinet 10 may also include circuit boards, circuitry and processor components for computerized control. One skilled in the art, however, will realize that other materials and fabrication methods suitable for assembly and manufacture, in accordance with the present disclosure, also would be appropriate.

Cabinet 10 is an enclosure, which includes an interior space 12. Interior space 12 is defined by a top portion 14, a bottom portion 16, a front wall 18 and a rear wall 20. Cabinet 10 also includes side walls 22, 24. Cabinet 10 defines interior space 12 to provide a closed loop gas distribution pathway, discussed in more detail below, for regulating temperature and cooling components disposed within cabinet 10. Cabinet 10 may include shelving and/or racks for support of electronic equipment according to the particular application. It is contemplated that interior space 12 may have various geometric configurations such as rectangular, oval, circular and polygonal, according to the particular flow application. It is further contemplated that interior space 12 may be continuous within cabinet 10 or separated into a plurality of sections within cabinet 10.

In an alternate embodiment, top portion 14 may include a cable tray assembly configured to support cables or the like connected with blade servers 32.

Front wall 18 includes a front door 26 and is gas impervious to facilitate the closed loop gas flow distribution pathway within interior space 12. It is envisioned that front door 26 has a solid configuration and can be fabricated from plexi-glass. Other materials are also contemplated. Front door 26 may have a varying thickness along its length, or include one or a plurality of layers. It is further envisioned that cabinet 10 may include portions of the gas flow distribution pathway outside of interior space 12, and that front wall 18 may include openings for connections thereto.

Rear wall 20 includes a rear door 28, which is gas impervious to facilitate the closed loop gas flow distribution pathway within interior space 12. It is envisioned that rear door 28 has a solid configuration. Rear door 28 may have a varying thickness along its length, or include one or a plurality of layers. It is further envisioned that cabinet 10 may include portions of the gas flow distribution pathway outside of interior space 12, and that rear wall 20 may include openings for connections thereto. Front wall 18 and rear wall 20 may be insulated. Front door 26 and rear door 28 or portions thereof may be transparent, opaque or varying degrees therebetween.

Figure 2:
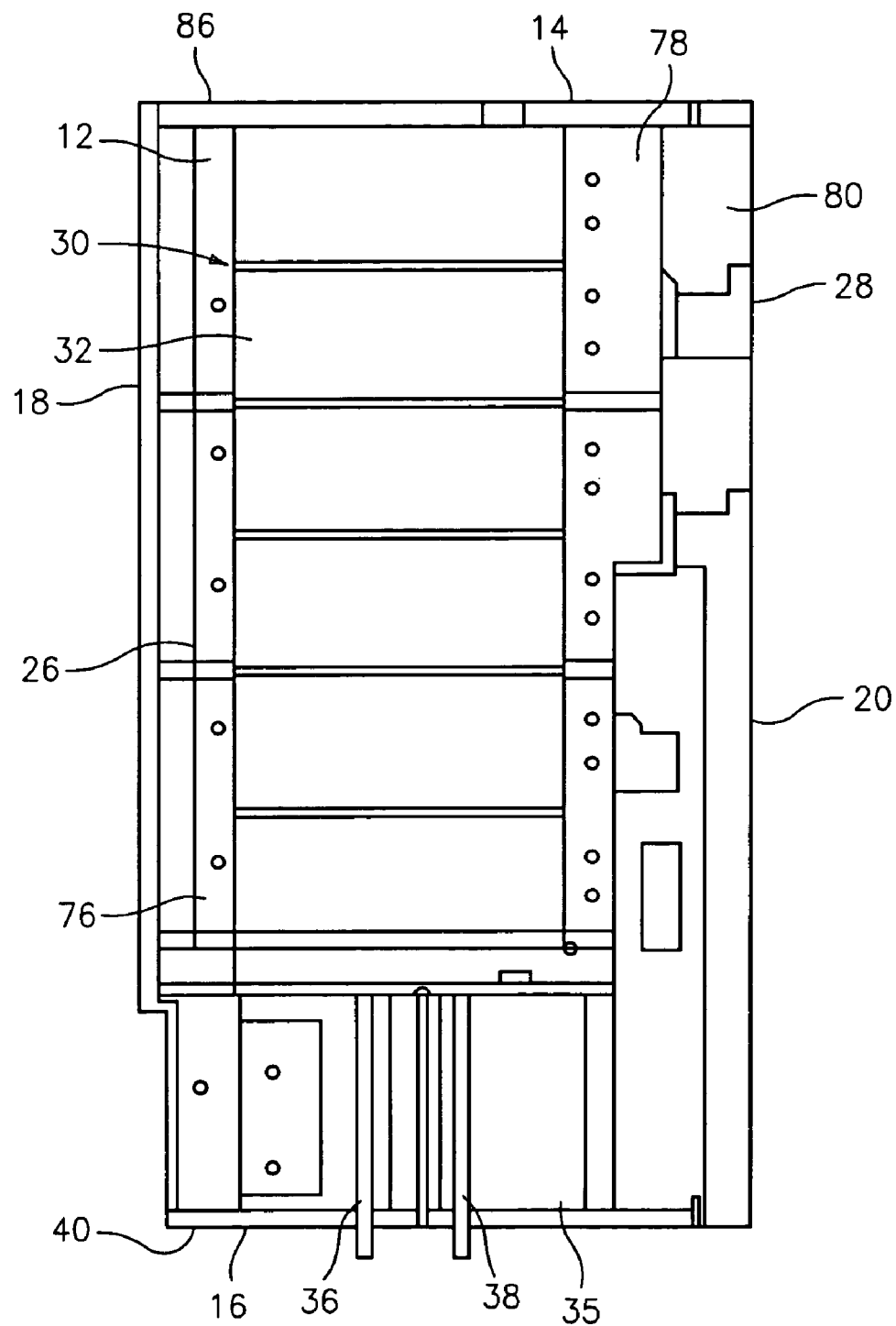
FIG. 2 is a side cross-section view of the cabinet system shown in FIG. 1.
Figure 3:
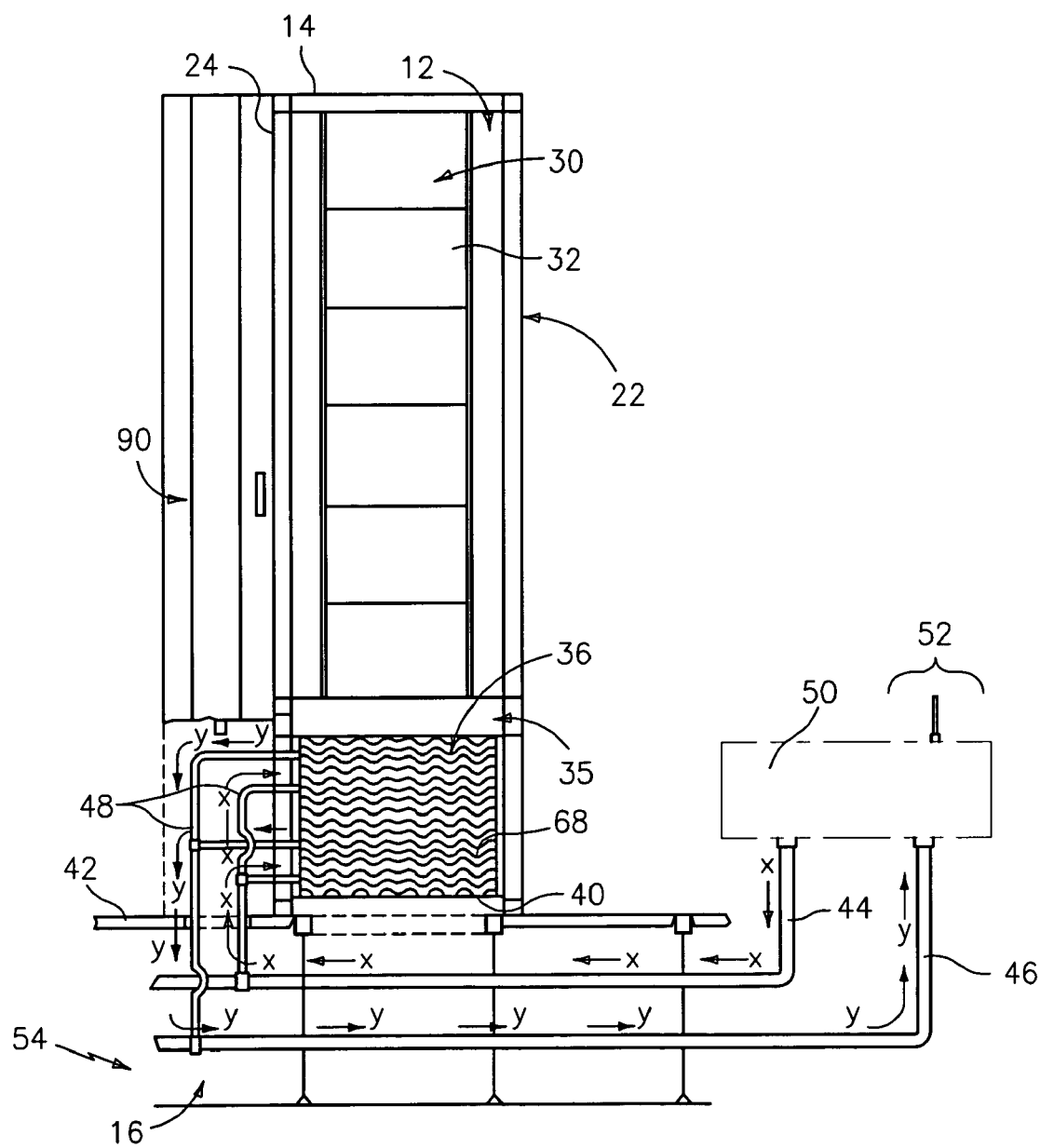
FIG. 3 is a front view of the cabinet system shown in FIG. 1 illustrating components thereof in association with a fluid supply/return.
Figure 4:
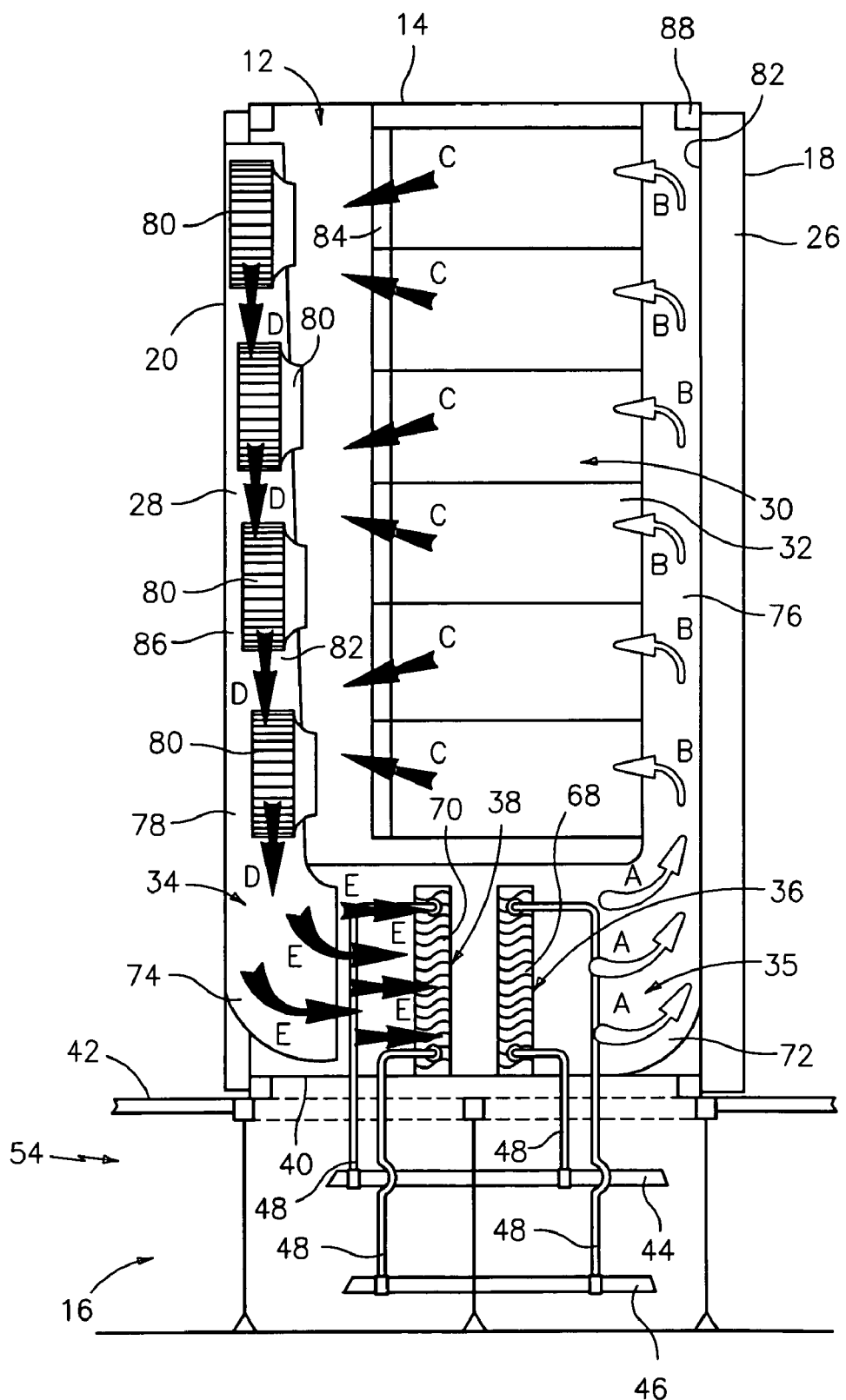
FIG. 4 is a side view of the cabinet system shown in FIG. 1 illustrating components thereof in association with a fluid supply/return.

A plurality of racks 30 are disposed within interior space 12 and configured to support blade server chassis' 32, as shown in FIGS. 2-4. Racks 30 are slidably mounted with cabinet 10, as is known to one skilled in the art. It is contemplated that racks 30 may support various types of electronic and/or telecommunication equipment such as computers, data servers, storage systems, communication devices and audio/video components. It is envisioned that cabinet 10 is configured to support electronic equipment that can generate various amounts of heat load, including high density and extreme high density applications. For example, heat loads of up to 42 kW or more are envisioned. It is contemplated that the cabinet system can simulate standard datacenter design and handle heat loads of up to six 7 RU (rack unit) blade chassis.

Bottom portion 16 communicates with a gas flow distribution pathway 34 of cabinet 10, as shown in FIG. 4. Bottom portion 16 includes a base plenum 35, which is configured for disposal of a first heat exchanger 36 and a second heat exchanger 38. Heat exchangers 36, 38 are mounted to a base panel 40 of bottom portion 16 and disposed within gas flow distribution pathway 34. Base panel 40 is gas impervious and encloses base plenum 35, which is disposed adjacent or mounted with a floor 42 of a computer room or the like, where cabinet 10 is located. Base panel 40 includes condensate catch pans 40a and 40b for capturing condensate from heat exchangers 36, 38, respectively, as shown in FIG. 5.

Figure 5:
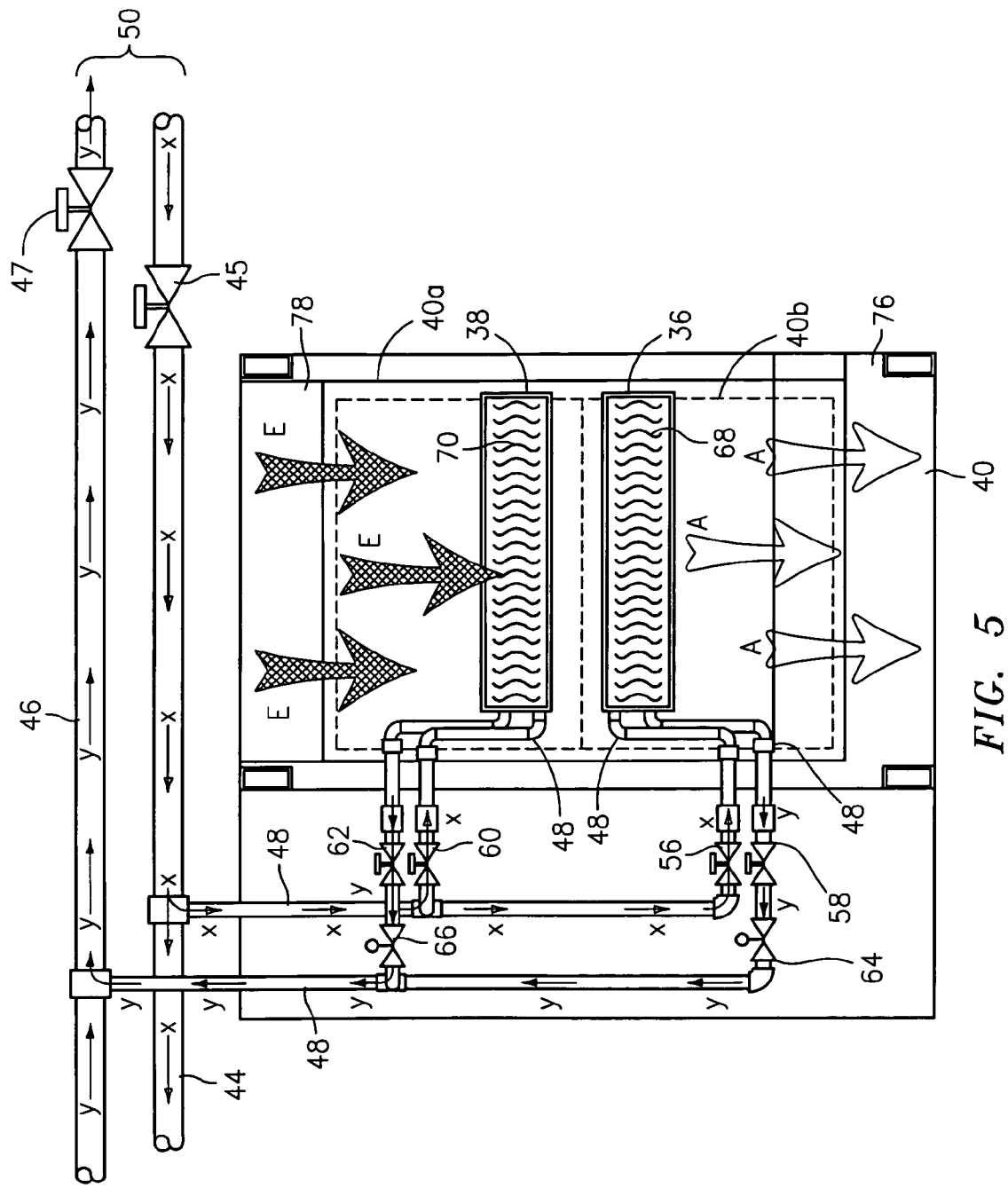
FIG. 5 is a plan view of the cabinet system shown in FIG. 1 illustrating internal components thereof in association with a fluid supply/return.

Heat exchangers 36, 38 are connected to a low temperature fluid supply, such as, for example, a cool water supply 44 and a high or warm temperature fluid return, such as, for example, a warm water return 46 via a fluid connection, such as, for example, piping 48, as shown in FIGS. 3-5. Cool water supply 44 and warm water return 46 fluidly communicate with a chiller 50, and a building water supply 52, associated with the computer room or building housing cabinet 10. Cool water supply 44 and warm water return 46 fluidly communicate with a chiller 50, as is known to one skilled in the art, to remove heat from the higher temperature water of warm water return 46 and provide lower temperature, cooling water via cool water supply 44 to heat exchangers 36, 38. Low temperature fluid or cool water is supplied to heat exchangers 36, 38 via cool water supply 44 from chiller 50, as shown by arrows X. High temperature fluid or warm water is returned to chiller 50 via warm water return 46, as shown by arrows Y. Cool water supply 44 and warm water return 46 are disposed in a floor plenum 54 disposed below floor 42. It is contemplated that the low temperature fluid may be supplied in a temperature range of 40-70 degrees Fahrenheit (F.). It is further contemplated that the high temperature fluid may be returned in a temperature range of 70-130 degrees F. Other temperature ranges are also contemplated according to the requirement of a particular cabinet application.

Piping 48 includes shut off valves 56, 58 configured to facilitate and discontinue fluid flow between heat exchanger 36 and, cool water supply 44 and warm water return 46, respectively. Piping 48 also includes shut off valves 60, 62 configured to facilitate and discontinue fluid flow between heat exchanger 38 and, cool water supply 44 and warm water return 46, respectively. Cool water supply 44 includes a shut off valve 45 and warm water return 46 includes a shut off valve 47.

A mixing valve 64 is disposed with piping 48 between heat exchanger 36 and warm water return 46. Mixing valve 64 utilizes high temperature water generated from the high temperature gas from gas flow distribution pathway 34, absorbed through coils 68, to regulate low temperature water flow to heat exchanger 36. A mixing valve 66 is disposed with piping 48 between heat exchanger 38 and warm water return 46. Mixing valve 66 utilizes high temperature water generated from the high temperature gas from gas flow distribution pathway 34, absorbed through coils 70, to regulate low temperature water flow to heat exchanger 38.

Cool water supply 44 communicates with coils 68 of heat exchanger 36 and coils 70 of heat exchanger 38 via piping 48. Coils 68, 70 facilitate the supply and circulation of low temperature fluid, such as cool water, through heat exchangers 36, 38. As high temperature gas, such as hot air, passes across coils 68, 70, heat from the hot air is absorbed by the cool water, thereby reducing the temperature of the air and directing cooled air through gas flow distribution pathway 34. Upon absorption of heat, the cool water in coils 68, 70 becomes a high temperature fluid, such as warm water, which is circulated to warm water return 46 via piping 48. It is contemplated that the low temperature gas may be in a temperature range of 40-70 degrees F. It is further contemplated that the high temperature gas may be in a temperature range of 70-130 degrees F. Other temperature ranges are also contemplated according to the requirement of a particular cabinet application.

It is envisioned that heat exchangers 36, 38 may each be designed for a 42 kW load. Heat exchangers 36, 38 may be hot swappable. It is contemplated that one or a plurality of heat exchangers may be employed with cabinet 10 and variously disposed about interior space 12.

Base plenum 34 has a front section 72 and a rear section 74. Front section 72 is configured to divert and direct air cooled by heat exchangers 36, 38 to a first plenum, such as, for example, a front plenum 76 of gas flow distribution pathway 34. Rear section 74 is configured to divert and direct high temperature gas, from a second plenum, such as, for example, a rear plenum 78, generated by blade servers 32 to heat exchangers 36, 38 in gas flow distribution pathway 34.

Front plenum 76 is disposed between front wall 18 and racks 30. The cool air from front section 72 is directed to front plenum 76, as shown by arrows A, which creates a passageway of cool air to racks 30, as shown by arrows B. The cool air gas flow is directed about the surfaces of the heat generating blade servers 32. The cool air gas flow absorbs heat thereby maintaining an acceptable working temperature for blade sensors 32 and avoids overheating. As the cool air gas flow absorbs heat, the cool air gas flow transforms into a high temperature gas flow, which is exhausted from racks 30, as shown by arrows C.

Rear plenum 78 is disposed between rear wall 20 and racks 30. The high temperature gas flow from racks 30 is directed to and received within rear plenum 78. A plurality of fans 80 are mounted with a shroud 82 that defines rear plenum 78. Fans 80 are mounted in linear alignment along rear plenum 146. Fans 80 are arranged in a configuration to draw the high temperature gas flow exhausted from racks 30 and interior space 12 into rear plenum 78. Fans 80 are processor controlled such that the fan speed of fans 80 can be varied according to temperature requirements for a particular application. Fans 80 direct the high temperature gas flow to rear section 74, as shown by arrows D, and heat exchangers 36, 38, as shown by arrows E, in gas flow distribution pathway 34. It is envisioned that fans 80 are variably speed fans and may provide ranges of CFM output up to 2900 CFM. It is further envisioned that one or a plurality of fans may be used. In a preferred embodiment, four (4), 1650 CFM fans are employed.

A temperature sensor 82 is disposed with front plenum 76 and mounted to sense the temperature of the cool air directed to front plenum 76. A temperature sensor 84 is disposed with interior space 12 adjacent the high temperature gas flow exhausted from blade servers 32 and mounted to sense the temperature of the high temperature gas. A pressure sensor 86 is disposed with rear plenum 78 and mounted to sense fan pressure of fans 80. It is contemplated that sensors 82, 84, 86 may include one or a plurality of sensors disposed in predetermined locations.

A thermal control module 88 is disposed with top portion 14 and mounted adjacent front wall 18. Thermal control module 88 communicates with temperature sensor 82 and is connected therewith to receive temperature data for the intake gas flow associated with the low temperature gas. Thermal control module 88 also communicates with temperature sensor 84 and is connected therewith to receive temperature data for the exhaust gas flow associated with the high temperature gas. Thermal control module 88 also communicates with pressure sensor 86 and is connected therewith to receive pressure data for fans 80. It is envisioned that thermal control module 88 may control various parameters associated with thermal management of cabinet 10 such as gas temperature, fan pressure, power monitor and consumption, fluid leakage, fluid flow, humidity, fluid temperature and environmental parameters.

Thermal control module 88 is a processor controlling module configured for managing conditions of interior space 12, including regulating the temperature of the exhaust flow from servers 32. Thermal control module 88 regulates exhaust gas flow temperature via operation control of fans 80 and heat exchangers 36, 38 and the components associated therewith. Thermal control module 88 collects temperature and pressure data from the sensors discussed above and supplies such data to its processor. The processor compares such data with a predetermined exhaust gas flow set point temperature. The set point temperature is pre programmed into thermal control module 88.

It is envisioned that based on the comparison of temperature server data with the set point temperature, thermal control module 88 sends out signals to the temperature regulation components, e.g., fans 80 and heat exchangers 36, 38 and the components associated therewith. Based on the variation of the data from the set point temperature, the processor of module 88 determines the appropriate combination of operation of temperature regulation components. Thermal control module 88 continues temperature maintenance and control during operation of the electronic equipment housed and maintained by cabinet 10.

Cabinet 10 includes a sidecar assembly 90, which is mounted with side wall 24, as shown in FIGS. 1 and 3. Sidecar assembly 90 is configured to support cables, etc. of blade servers 32. Sidecar assembly 90 provides cabinet 10 with the capability to handle increased cabling in a datacenter and reduces the negative impact cabling has on thermal capacity, in particular, heat dissipation in cabinet 10. Sidecar assembly 90 has an external cable management configuration for passive, high density and extreme high density enclosures, which removes the bulk of cabling and power out of cabinet 10.

In use, cabinet 10 is configured for maintaining electronic equipment, such as, for example, blade sensors 32 at a predetermined set point temperature according to an acceptable working temperature for a particular application. Cabinet 10, similar to that described above, is disposed in a room, such as a computer room or similar electronic equipment storage space, which is associated with a chiller 50, and building water supply 52, associated with the computer room or building housing cabinet 10.

Blade servers 32 generate heat during operation. Thermal control module 88 is pre-programmed for a set point temperature according to an acceptable working temperature for blade servers 32. Fans 80 are cycled on to draw high temperature exhaust gas flow from racks 30, as discussed above. Temperature sensor 84 senses temperature of exhaust gas flow and communicates corresponding temperature sensing data to thermal control module 88. Based on the deviation of the temperature sensed by temperature sensor 84 from the acceptable working temperature for blade servers 32, thermal control module 88 powers a combination of fans 80 and heat exchangers 36, 38 and the components associated therewith. Based on the processor controlled operation of these components of cabinet 10, gas flow distribution pathway 34 maintains the acceptable working temperature for blade servers 32 within cabinet 10.

As determined by thermal control module 88, fans 80 adjust to draw the high temperature gas through rear plenum 86, as shown by arrows D, and into rear section 74. The high temperature gas or hot air is directed to heat exchangers 36, 38, as shown by arrows E. Cool water supply 44 supplies low temperature fluid such as cool water to heat exchangers 36, 38, as shown by arrows X. Cool water circulates through coils 68, 70 via piping 48. As the hot exhaust air passes across coils 68, 70, heat from the hot air is absorbed by the cool water, thereby reducing the temperature of the air and directing cooled air through base plenum 35 to front plenum 76, as shown by arrows A, through gas flow distribution pathway 34. Upon absorption of heat, the cool water in coils 68, 70 becomes a high temperature fluid, such as warm water, which is circulated to warm water return 46 via piping 48, as shown by arrows Y.

The cool air from front section 72 is directed to front plenum 76, as shown by arrows A, which creates a passageway of cool air to racks 30, as shown by arrows B. The cool air gas flow is directed about the surfaces of the heat generating blade servers 32. The cool air gas flow absorbs heat thereby maintaining an acceptable working temperature for blade sensors 32 and avoids overheating. As the cool air gas flow absorbs heat, the cool air gas flow transforms into a high temperature gas flow, which is exhausted from racks 30, as shown by arrows C and discussed above.

Thermal control module 88 continues this operation loop for maintaining acceptable working temperature during operation of blade servers 32 stored within cabinet 10 in a closed loop, fluid cooled design that employs a heat exchanger for regulating temperature and cooling heat generating electronic components. The cabinet system actively monitors and balances internal heat loads, ensuring a stable and reliable operating environment. It is envisioned that cabinet 100 has a capacity for heat loads of up to six 7 RU blade chassis. It is contemplated that the acceptable working temperature may be in a temperature range of 60-85 degrees F. Other temperature ranges are also contemplated according to the requirements of a particular cabinet application.

In another alternate embodiment, cabinet 10 may include a thermal module having an input/output micro controller. The micro controller is adapted to control and monitor a plurality of variants with cabinet 10. Such variants may include temperature, power, door access, vibration, humidity, fan speed, and other measurable and controllable elements within cabinet 10. The micro controller receives power from a cabinet power supply. The micro controller may include a visual display to convey visual information to an operator of cabinet 10. This enables the operator in close proximity of cabinet 100 to monitor variants within the cabinet. In addition, the micro controller may include a visual display to convey a message to the operator. Various inputs may be programmed into the micro controller, such as temperature, power, humidity, fan speed, leakage and alarm.

Accordingly, it is to be understood that the embodiments of the invention herein described are merely illustrative of the application of the principles of the invention. Reference herein to details of the illustrated embodiments is not intended to limit the scope of the Claims.

What is claimed is:
1. An electronic equipment cabinet comprising:
   an enclosure defining an interior space and having an upper portion and a lower portion;
   a support being disposed with the interior space and being configured to receive electronic equipment,
   the lower portion defining a base plenum configured for disposal of at least one heat exchanger, the at least one heat exchanger being in fluid communication with a low temperature fluid supply and a high temperature fluid return, and configured to reduce a high temperature gas to a low temperature gas;
   a closed loop gas flow distribution pathway including a first plenum communicating with the base plenum and being configured to direct the low temperature gas to the support,
   the gas flow distribution pathway further including a second plenum configured to receive a high temperature gas flow from the support and direct the high temperature gas flow to the base plenum;
   a temperature sensor being disposed with the enclosure to sense the temperature of the high temperature gas flow within the enclosure;
   a pressure sensor being disposed with the enclosure to sense the pressure of the at least one fan; and a control module configured to receive temperature sensing data from the temperature sensor and pressure sensing data from the pressure sensor to control the at least one fan and the at least one heat exchanger for regulating temperature of the high temperature gas flow.

2. An electronic equipment cabinet according to claim 1, wherein the enclosure includes a front wall and a rear wall.

3. An electronic equipment cabinet according to claim 1, wherein the second plenum includes at least one fan configured to receive the high temperature gas flow from the support and direct the high temperature gas flow to the base plenum.

4. An electronic equipment cabinet according to claim 1, wherein the second plenum includes a plurality of fans configured to receive the high temperature gas flow from the support and direct the high temperature gas flow to the base plenum.

5. An electronic equipment cabinet according to claim 1, further comprising an intake temperature sensor being disposed with the enclosure to sense the temperature of the low temperature gas flow within the enclosure.

6. An electronic equipment cabinet according to claim 1, wherein the support includes shelving configured to receive electronic equipment.

7. An electronic equipment cabinet according to claim 1, wherein the support is configured to receive at least one blade server chassis.

8. An electronic equipment cabinet according to claim 1, wherein the upper portion includes a cable trough.

9. An electronic equipment cabinet according to claim 1, wherein the support is configured to receive a plurality of blade server chassis.

10. An electronic equipment cabinet according to claim 1, wherein the at least one heat exchanger includes a plurality of heat exchangers.

11. An electronic equipment cabinet according to claim 1, further comprising a mixing valve disposed between the at least one heat exchanger and the high temperature fluid return, the mixing valve being configured to regulate temperature of the low temperature fluid supply to the at least one heat exchanger.

12. An electronic equipment cabinet according to claim 1, wherein the low temperature fluid supply and the high temperature fluid return are connected to a chiller.

13. An electronic equipment cabinet according to claim 1, wherein the second plenum is defined by a shroud.

14. An electronic equipment cabinet according to claim 1, wherein the second plenum includes a plurality of fans disposed in linear alignment therealong.

15. An electronic equipment cabinet according to claim 1, wherein at least a portion of the low temperature fluid supply and the high temperature fluid return are disposed in a floor plenum external to the closed loop gas flow distribution pathway.

16. A method for maintaining electronic equipment at a predetermined temperature, comprising the steps of:
a) providing an electronic equipment cabinet, which includes,
an enclosure defining an interior space and having an upper portion and a lower portion;
a support being disposed with the interior space and being configured to receive electronic equipment,
the lower portion defining a base plenum configured for disposal of at least one heat exchanger, the at least one heat exchanger being in fluid communication with a low temperature fluid supply and a high temperature fluid return, and configured to reduce a high temperature gas to a low temperature gas;
a closed loop gas flow distribution pathway including a first plenum communicating with the base plenum and being configured to direct the low temperature gas to the support,
the gas flow distribution pathway further including a second plenum configured to receive a high temperature gas flow from the support and direct the high temperature gas flow to the base plenum,
a temperature sensor being disposed with the enclosure to sense the temperature of the high temperature gas flow within the enclosure,
a pressure sensor being disposed with the enclosure to sense the pressure of the at least one fan, and
a control module configured to receive temperature sensing data from the temperature sensor and pressure sensing data from the pressure sensor to control the at least one fan and the at least one heat exchanger for regulating temperature of the high temperature gas flow;
b) forcing the high temperature gas into the base plenum with at least one fan of the second plenum;
c) drawing the high temperature gas across the at least one heat exchanger and reducing the high temperature gas to a low temperature gas;
d) drawing the low temperature gas from the base plenum into the first plenum;
e) drawing the low temperature gas across the support to absorb heat and raise to the high temperature gas that is drawn into the second plenum with the at least one fan of the second plenum;
f) sensing the temperature of the high temperature gas flow drawn into the second plenum; and
g) controlling the temperature of the high temperature gas with the control module based on the temperature sensing data.

17. An electronic equipment cabinet comprising:
an enclosure including an interior space defined by a top portion, a bottom portion, a front wall and a rear wall thereof;
a plurality of racks configured to support blade servers and being disposed with the interior space of the enclosure;
the bottom portion defining a base plenum configured for disposal of two heat exchangers, the heat exchangers being in fluid communication with a low temperature fluid supply and a high temperature fluid return, and configured to reduce a high temperature gas to a low temperature gas;
a closed loop gas flow distribution pathway including a front plenum communicating with the base plenum and being configured to direct the low temperature gas to the support,
the gas flow distribution pathway further including a rear plenum including a plurality of fans configured to draw a high temperature gas flow from the support and direct the high temperature gas flow to the base plenum;
a first temperature sensor being disposed with the enclosure to sense the temperature of the high temperature gas flow within the enclosure, a second temperature sensor being disposed with the enclosure to sense the temperature of the low temperature gas flow within the enclosure, and a pressure sensor being disposed with the enclosure to sense the pressure of the plurality of fans; and
a control module disposed with the enclosure and communicating with the sensors to receive data to control the fans and heat exchangers for regulating the temperature of the high temperature gas and the low temperature gas.

* * * * *